United States Patent [19]

Bajka et al.

[11] Patent Number: 4,501,770
[45] Date of Patent: Feb. 26, 1985

[54] METHOD FOR REMOVING SOLDER FROM THE DRILL HOLES OF EMPTY PRINTED CIRCUIT BOARDS COATED WITH SOLDER

[75] Inventors: Imre Bajka, Niederglatt; Robert Furrer, Zurich, both of Switzerland

[73] Assignee: Siemens Aktiengesellschaft Berlin & München, Munich, Fed. Rep. of Germany

[21] Appl. No.: 365,642

[22] Filed: Apr. 5, 1982

[30] Foreign Application Priority Data

Apr. 15, 1981 [CH] Switzerland ............ 2512/81

[51] Int. Cl.³ ............ B05D 3/12; B05D 1/18
[52] U.S. Cl. .................. 427/97; 427/347; 427/433; 427/444
[58] Field of Search ........... 427/347, 346, 97, 433, 427/444; 118/57

[56] References Cited

U.S. PATENT DOCUMENTS

| | | | |
|---|---|---|---|
| 1,397,175 | 11/1921 | Mowry | 427/347 |
| 2,267,273 | 12/1941 | Garbe | 118/57 X |
| 4,129,668 | 12/1978 | Rouquié | 118/57 X |

FOREIGN PATENT DOCUMENTS 219503  5/1957  Australia ............ 427/347

Primary Examiner—Evan K. Lawrence
Attorney, Agent, or Firm—Werner W. Kleeman

[57] ABSTRACT

During the pre-soldering of printed circuit boards, as a rule, also the drill holes or bores and, in particular, the through-metallized drill holes are filled in an undesirable manner with solder. This solder must be removed before mounting the electrical components or elements upon the printed circuit boards. A simple method is disclosed for this purpose, affording a faultless de-soldering of the drill holes, without deleteriously affecting the properties of the solder material. The printed circuit boards, in a condition where the solder applied during the pre-soldering operation is still molten, are accelerated at least once and thereafter suddenly brought to standstill in such a fashion that the excess solder is knocked or propelled out of the drill holes. The apparatus for accomplishing the method contemplates guiding the printed circuit board essentially horizontally in a frame and accelerating such printed circuit board in a guided vertical drop or fall in the direction of an impact location, so that upon concussion of the frame at the impact location the excess solder is downwardly knocked or propelled out.

10 Claims, 5 Drawing Figures

Fig. 1
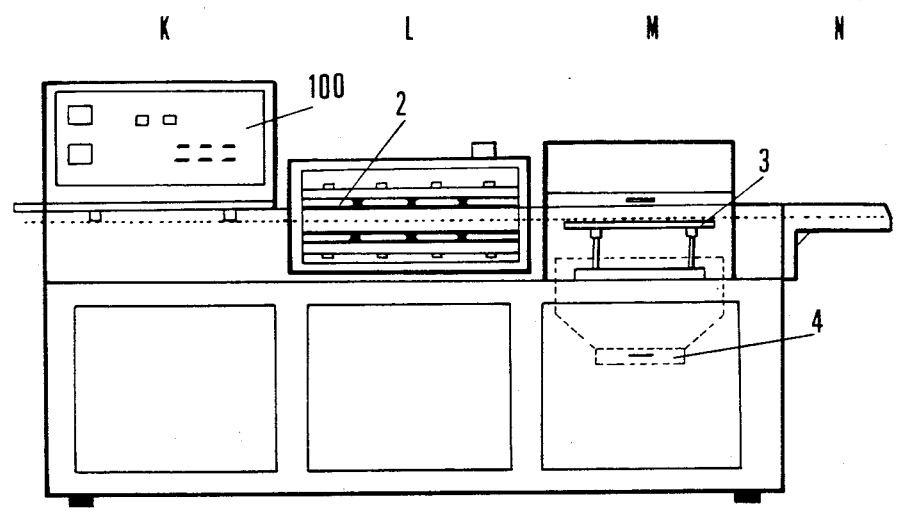
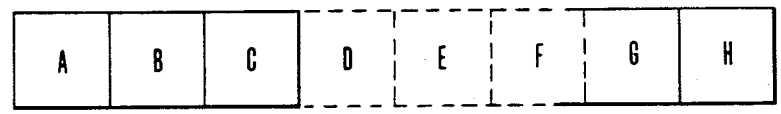
Fig. 3

METHOD FOR REMOVING SOLDER FROM THE DRILL HOLES OF EMPTY PRINTED CIRCUIT BOARDS COATED WITH SOLDER

BACKGROUND OF THE INVENTION

The present invention relates to a new and improved method for removing solder from the drill holes or bores of component-free printed circuit boards coated with solder.

During the production of printed circuit boards for printed circuits there is frequently applied, as a final step in the fabrication process, a protective solderable coating to the printed circuit boards, so that, among other things, there can be improved their storage retention properties or shelf life. The possibility exists of coating the conductor tracks of the printed circuit boards in accordance with one of the state-of-the-art methods, such as immersion soldering, splash bath soldering and so forth, with a solder layer of a predetermined thickness. As a general rule, however, when performing these solder-coating methods also the drill holes or the like and, in particular, the through-metallized holes of the printed circuit boards are filled with solder which, at the latest, must be again removed prior to mounting the electrical components or elements at the printed circuit boards. Under the expression "solder" as used in the context of this disclosure there is to be understood all those solder alloys which can be conventionally employed during the soldering of printed circuit boards. Equally, at times in this disclosure reference may be made to "de-tinning" and such term is to be used in its broader sense as encompassing not only the removal of solder containing tin but other types of solders which might be beneficially employed in conjunction with printed circuit boards.

To free the drill holes from excess solder there have become known to the art different methods and apparatuses. Thus, for instance, there has been proposed a so-called solder centrifuge which receives a printed circuit board coated with a flux agent, immerses such in a vat or receptacle containing a molten solder and after removal therefrom rotates the plate or printed circuit board in such a manner that, the excess solder is removed out of the holes by the action of the centrifugal force. Such type of equipment requires an appreciable mechanical expenditure.

A further method known to the art has been designated as the so-called hot air solder leveling process. Significant in this regard is the publication "Proceedings of the First Printed Circuit World Convention", Volume 2, June 5–8, 1978, the article of D. Schoenthaler, entitled "Solder Coating Thickness Considerations for Hot Gas Solder Leveling", pages 2.4.1 to 2.4.8. With this technique the printed circuit boards or plates are attached in a holder, immersed in a molten solder bath and directly after removal therefrom contacted at both sides or faces with hot compressed air, so that there is here likewise accomplished freeing of the drill holes from the excess solder. Practical experience has shown, however, that this technique is not devoid of its problems. With this method, as far as the resultant solder layer thickness in the drill holes is concerned, there is decisive, apart from the solder composition, the solder bath temperature, the residence time in the solder bath and the withdrawal speed, also the angle of the hot air nozzles with respect to the plane of the printed circuit boards, their spacing from the printed circuit boards as well as the pressure and temperature of the hot air. In particular, the optimum setting of the last four-mentioned parameters can be particularly difficult and quite different depending upon the type of printed circuit board which is being processed. Also, with this state-of-the-art method the danger exists that the drill holes will be freed to a greater extent than permissible, at the region of their edges, from the solder by the action of the compressed air and at these locations undesirable oxidation of the conductor material will occur. Furthermore, during the blowing-out operation there must be expected an uncontrolled flying about of solder spatters which, for instance, again could undesirably resettle in the drill holes. Furthermore, with such prior art equipment measures must be provided for removal of the noxious metallic vapors which are circulated during the blowing operation. Thus, on balance, an apparatus operating according to this state-of-the-art method, requires a relalively large amount of space and equipement expenditure, so that it is not readily possible to incorporate such equipement in an extensively automated production line. The mere requirement of providing a source of hot compressed air and the corresponding higher energy consumption, renders questionnable, under circumstances, the economically justifiable employment of such method.

SUMMARY OF THE INVENTION

Therefore, with the foregoing in mind, it is a primary object of the present invention to provide a new and improved method for the removal of solder from the drill holes of component-free or componentless printed circuit boards coated with solder, in a manner not afflicted with the aforementioned drawbacks and limitations of the prior proposals.

Another and more specific object of the present invention aims at the provision of a new and improved method for the removal of the solder from undesired locations of printed circuit boards or the like without encoutering the aforementioned difficulties, and additionally, renders possible in a most simple fashion a relatively faultless freeing of the drill holes from excess solder without impairment of its solder properties.

Still a further significant object of the present invention aims at a new and improved method for removing solder from printed circuit boards.

Now in order to implement these and still further objects of the invention, which will become more readily apparent as the description proceeds, the method aspects of the present development are manifested by the features that the printed circuit board is accelerated at least once while in a condition where the applied solder is still molten, and thereafter suddenly brought to standstill in a manner such that the excess solder is simultaneously knocked or propelled out of all of the drill holes.

BRIEF DESCRIPTION OF THE DRAWINGS

The invention will be better understood and objects other than those set forth above, will become apparent when consideration is given to the following detailed description thereof. Such description makes reference to the annexed drawings wherein:

FIG. 1 schematically illustrates the essential components or units of a solder-removal apparatus for performance of the method of the invention;

FIG. 3 illustrates a general flow diagram which can be used with the method and at a complete solder-applying and de-soldering installation;

DETAILED DESCRIPTION OF THE PREFERRED EMBODIMENTS

Figure 2:
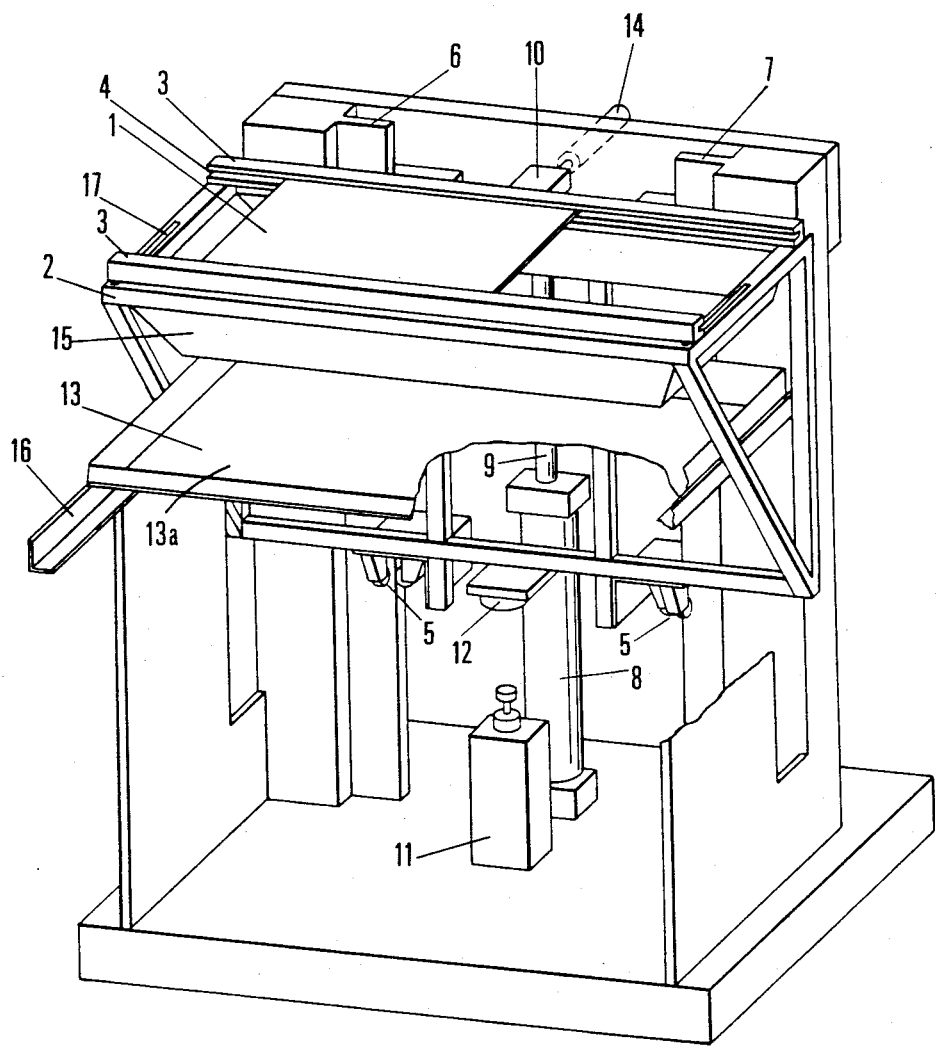
FIG. 2 is a perspective view illustrating details of the apparatus arrangement of FIG. 1, where the drill holes of the pre-soldered or pre-tinned printed circuit boards are freed of excess solders.

Describing now the drawings, it is to be understood that only enough of the construction of the various embodiments of solder-removal apparatus disclosed herein, by way of example and not limitation, has been shown in the drawings as will enable those skilled in the art to readily understand the underlying principles and concepts of the present development, while simplifying the illustration of the drawings. Turning attention now to the embodiment of solder-removal apparatus depicted in FIG. 1, such will be seen to contain four stations, namely a preparatory station K, a heating station L, a de-soldering station M, and a delivery or outfeed station N. Such apparatus or installation serves for processing already pre-soldered printed circuit boards, and the processing thereof encompasses removing excess solder from the drill holes or the like of such printed circuit boards, in order to prepare the thus processed printed circuit boards so that there subsequently can be mounted thereat the intended electrical components or elements. The pre-soldering or pre-tinning of the printed circuit boards is accomplished in any conventional fashion, and therefore, need not be here further explained, for instance by immersion soldering or splash bath soldering techniques. The pre-soldered printed circuit boards, after having been contacted with a suitable flux or fluxing agent, are inputted to the preparatory station K, from which location they automatically cyclically travel in a substantially horizontal position through the apparatus, in a predetermined cycle time, until reaching the delivery station N. The cycle times, as well as other parameters which are relevant for the course of the processing operation, can be conveniently set at any suitable control device 100. A printed circuit board 1 which has been delivered to the preparatory station K initially is placed at that location into a waiting or hold position. As soon as the working cycle permits the printed circuit board is then transferred, at a proper point in the cycle time, to a transport system travelling along the broken horizontal line shown in FIG. 1 through the equipment and transferred to the heating station L. This heating station L contains, for instance, a heatable closed chamber. There can be conveniently provided as the thermal energy source infrared radiating devices 2 which irradiate the inserted printed circuit board 1 from below and/or from above over its entire surface. The temperature at the heating station L can be randomly adjusted or set, and likewise the spacing of the infrared radiating devices 2 from the surface of the printed circuit boards can be altered, as desired. Of course, other known techniques can be used for melting the solder upon the printed circuit boards, such as, for instance, immersion of the printed circuit boards in a solder oil or in a molten solder bath and so forth. As soon as following a certain residence time a printed circuit board has attained the solder melt temperature, then such printed circuit board is displaced into the de-soldering station M for the purpose of removing the fluid solder out of the drill holes of such printed circuit board. The de-soldering station M essentially comprises a displaceable holder or support arrangement 3 for the printed circuit board and a vat or container 4 located therebelow.

FIG. 2 illustrates details of the de-soldering station M to the extent that such are of significance for explaining the inventive method. The printed circuit board 1 is displaced from the heating station L onto a guided frame or frame member 2 containing two essentially parallel holder rails 3. These holder rails 3 each are equipped with a groove or channel 4 in which there can be horizontally guided the printed circuit board 1. One of the holder rails 3 is rigidly connected with the frame 2, whereas the other holder rail 3 is parallelly displaceable, so that there can be conveniently introduced and handled printed circuit boards 1 of different dimensions. To that end, there are provided at both parts of the frame 2 which extend perpendicular to the holder rails 3 the slots 17 into which engage releasable attachment or fixation means which are mounted at the displaceable holder rail, these attachment means not being particularly shown in the drawings. Additionally, the holder rails 3 are advantageously appropriately constructed such that the width of the groove or channel 4 can be freely adjusted, and thus, can be accommodated to printed circuit boards 1 of different thickness. At the frame or frame means 2 there are also provided four sets of guide rolls 5, each set of guide rolls 5 containing three guide rolls, and in the drawings only the two lowermost guide rolls are visible. In each instance two sets of the guide rolls 5 are guided upon a related guide rail 6 and 7, respectively, extending essentially vertically with regard to the plane of the printed circuit board 1. The rails or rail members 6 and 7 extend substantially in parallellism to one another and are rigidly connected with a carrier or frame of the de-soldering station M (FIG. 1). Consequently, the entire guided frame 2 is vertically displaceable along the rails or rail members 6 and 7. The movement of the frame member of frame 2 is accomplished by means of a displacement or lift cylinder 8 or equivalent structure. For this purpose the frame 2 bears against a support or abutment 10 at a piston extension 9 of the displacement cylinder 8. Furthermore, there is provided a damping element 11, defining an impact location, upon which bears the frame 2 by means of a stop or impact member 12 after reaching its lowermost position. At the frame 2 there is arranged a vat or container 13 which can be conveniently retracted upon the rails 16. This vat or container 13 extends at least over the entire surface of the printed circuit board 1 in such a manner that, solder dropping off of the printed circuit board 1 can directly fall into the collecting vat or container 13. A collar 15 or equivalent structure having slightly inwardly inclined side surfaces facilitates the reception of the dropping solder at the vat or container 13.

Treatment of a printed circuit board 1 which has arrived at such de-soldering station M is accomplished in the following manner: The frame 2 is located in its uppermost position upon arrival of the printed circuit board 1 and is retained at that location by the not particularly reference piston of a further cylinder unit 14, this piston engaging at the support or abutment 10. On the other hand, the piston extension 9 of the displacement cylinder 8 is in its lower starting position. As soon as the printed circuit board 1 arriving from the heating station L has been completely inserted into the holder rails 3, then there is disabled or eliminated the arresting of the frame 2 by appropriately actuating the cylinder unit 14. This, in turn, causes a vertical drop of the frame 2 together with the printed circuit board 1. The frame 2 impacts by means of its stop or impact member 12 upon the damping element 11 and is braked. Consequently, the excess solder located in the drill holes of the printed circuit board 1 is propelled or knocked-out downwardly through the drill holes and collected in the collecting vat or container 13. Removal of the solder from the drill holes is possible because, by virtue of the heating operation occurring at the heating station L, the solder is still in a fluid or molten condition. Thereafter, the frame 2 is again raised into its starting position by the action of the displacement or lift cylinder 8. The printed circuit board 1 which has now been freed of the excess solder is thereafer, following cooling to a temperature where the solder remaining at the printed circuit board 1 solidifies, transferred into the delivery or outfeed station N (FIG. 1), from which location it then undergoes a conventional and therefore here not further described cleaning process. The frame or frame member 2 is then ready for receiving a new printed board 1 from the heating station L. Practical applications have shown that when performing the described procedures there can be obtained faultless printed circuit boards. The thickness of the solder layer at the critical locations at the region of the drill holes and, in particular, the drill hole-edges, satisfies high requirements. The apparatus shown in FIG. 2 for the de-soldering of the printed circuit boards can be incorporated without difficulty into a fully automated production line. It does not require any appreciable expenditure in operator time and it can be very simply and quickly adapted to different sizes of printed circuit boards. Of course, other constructions of equipment can be devised which are suitable for the performance of the inventive method and which are accommodated to the particular features of the encountered production line. The actuation of both cylinders can be accomplished by means of a conventional freely programmable control.

The vat or container 13 need not absolutely be connected with the frame 2. This vat 13 also could be arranged independently beneath the frame 2 at the region of fall of the printed circuit board 1, as such has been indicated in the de-soldering station M of FIG. 1. However, practical experience has demonstrated that there can be obtained an improvement as concerns the quality of the de-soldered drill holes if the vat or container 13, as described, is connected with the frame 2 and, consequently, participates in the drop or fall movement of the printed circuit board 1. The base or floor surface of the container 13 is located at a certain distance parallel to the surface of the printed circuit board and preferably is covered with a suitable material, for instance a metal sponge, which absorbs as completely as possible the impact energy of the downwardly propelled solder particles. With such type of arrangement there is disposed immediately below the printed circuit board 1 a space containing stationary air which is moved upon acceleration of the printed circuit board 1. In comparison to an arrangement having an independent vat or container 13 the printed circuit board 1 therefore, during its dropping movement, is exposed to an appreciably smaller air flow from below, so that it tend so cool off less rapidly. Hence, the drill holes are more uniformly de-soldered.

A further improvement is obtained if the floor 13a of the vat or container 13 which is rigidly connected with the frame 2 is constructed of multiple parts or elements in such a manner that, upon impact of the frame 2, it downwardly opens and only again recloses following the impact. The container floor 13a can be, for istance, subdivided into two floor halves in its lengthwise direction, these floor halves being downwardly deflected in the manner of a swinging door composed of two door wings or vanes following impact of the frame 2, and thereafter again being brought by the action of restoring springs or equivalent structure into their starting position forming the closed container floor or base. Upon opening of the container floor there is formed a suction action in the space beneath the printed circuit board 1, this suction action further enhancing the de-soldering operation. Additionally, the excess solder is not actually caught in the vat or container 13, rather it leaves therefrom through the open container floor, and thus prevents any respattering of solder particles.

In practice, the situation can arise that the one-time "knocking" of the printed circuit board is not always adequate to produce an optimum result as far as the solder layer is concerned at the region of the drill holes of the printed circuit board. Then, it is advantageous to subject the printed circuit board directly in succession to a number of accelerations and impact operations.

With a dual or double acceleration of the printed circuit boards it has been found to be advantageous if the first drop or fall path is selected to be shorter than the second drop or fall path. In this way there is achieved the beneficial result that during the first impact operation, with lesser energy, there is already removed a larger quantity of the solder out of the drill holes. During the second impact operation from a greater height there is then only knocked out or removed smaller quantities of solder, and particularly in the case of printed circuit boards which have been laminated at both faces, the solder spatters which still egress, especially possibly against the direction of movement of the printed circuit board, i.e. in upward direction, are then so small in number and size that they subsequently can be readily removed during a following cleaning process. A second "knocking" of the printed circuit board 1 can be realized relatively simply by appropriately controlling the displacement of lift cylinder 8. As soon as the printed circuit board 1 has been inserted in the uppermost position of the frame 2 which is supported upon the piston extension 9, the piston then is continuously downwardly moved until there has been attained the desired drop height for the first knocking operation. Thereafter, the piston is suddenly brought into its lower starting position, so that the frame 2 experiences a downward acceleration in a guided free fall until it impacts against the damping element 11. Thereafter, the frame 2, by appropriately actuating the displacement or lift cylinder 8, again is raised to a desired second fall or drop height—which, as explained, preferably is larger than the first fall height—and then in the same manner undergoes a free fall. In order to realize the second or even further knocking operations at the printed circuit board 1 there is only required an appropriate control of the displacement cylinder 8, something which is readily possible by means of a suitable programmable control without any appreciable difficulties.

In contrast to the embodiment described with reference to FIG. 2, where the printed circuit board 1 is accelerated in a free fall, the printed circuit board 1 can also be accelerated while in a controlled vertical drop or fall. For this purpose there is required a special control of the displacement cylinder 8 in that, its piston is moved at a predetermined acceleration downwardly and, consequently, the frame 2, bearing upon the piston extension 9 during the entire movement course, along with the printed circuit board 1 experiences a corresponding downward acceleration. The requisite acceleration values, in the first instance, are dependent upon the configuration of the printed circuit board as well as upon the quantity of excess solder which is to be knocked-out in each case. Therefore, the determination of such values can be accomplished empirically.

In the previous description of the invention it was assumed that the metallized regions of the printed circuit boards which are to be freed of solder were already coated with solder and such arrived in a cold condition at the de-soldering station. The inventive procedure for removing the excess solder can be, however, also advantageously employed in those instances where the printed circuit boards, in one continuous sequence, are covered with solder and directly thereafter, i.e., without any intermediate cooling, freed of excess solder. For purposes of more fully explaining this field of application or scheme there has been schematically illustrated in FIG. 3 the process steps in a fabrication or production line for the application of solder and the de-soldering of printed circuit boards. If the soldering and de-soldering is not accomplished in one sequence, rather in two separate procedures, then there result the following individual phases: For the soldering operation the printed circuit boards are covered with a flux agent during a phase A, pre-heated during a phase B, and have solder applied to one or both sides or faces during a phase C. For the subsequent de-soldering, which can be carried out at a random point in time following the soldering operation, the printed circuit boards, during a phase D, are again covered with a flux agent, held in a preparatory state during a phase E, heated to a temperature which melts the solder during a phase F, freed in accordance with the inventive method from excess solder during a phase G, and finally, during a phase H outfed for further processing. Now if the soldering and de-soldering operations are to be accomplished throughout an uninterrupted procedure without any intermediate cooling of the printed circuit board, then there are dispensed with the aforementioned phases D, E and F during the de-soldering operation. The printed circuit board need not again be heated prior to the de-soldering operation, since it is directly infed after the soldering operation, with the solder still liquid or fluid, to the de-soldering station and at that location freed of the excess solder. In this case there is only required part of the de-soldering apparatus of FIG. 1, namely the de-soldering station M and the outfeed or delivery station N, which assume the phases G and H in the flow diagram of FIG. 3.

Figure 4:
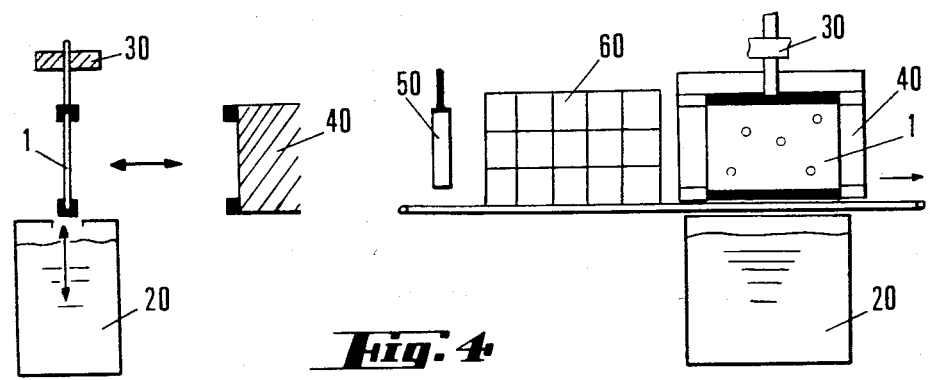
FIG. 4 illustrates a further embodiment of apparatus used for practicing the method.

The use of the described principle for the de-soldering of the printed circuit boards is not limited in any way to the previously described embodiment working with vertical drop of the printed circuit board while in a horizontal position. The basic concept of the method of this development, namely the de-soldering by "knocking-out" of the excess solder, can be employed in further variant embodiments. Thus, in FIG. 4 there has been shown a possible variant embodiment in two side views, wherein the pre-soldering of the printed circuit boards 1 or the melting of the solder of already pre-soldered printed circuit boards 1 is accomplished by vertical immersion in a molten solder bath 20, and the printed circuit board 1 is first covered with a flux agent 50 and can be pre-heated in a heating station 60. The printed circuit board 1 thereafter is vertically withdrawn in upward direction and impacts against a stop or impact member 30. Thus, initially the excess solder flowing downwardly along the surface of the printed circuit board 1 is knocked-out into this molten bath 20. Thereafter, the printed circuit board 1 is accelerated relative to a further impact location 40, in a direction perpendicular to the withdrawal direction, and then braked, so that upon impact the drill holes are now completely freed of excess solder. Directly thereafter the printed circuit board 1 is brought into its horizontal position, so that upon cooling of the printed circuit board 1 there is obtained a uniform solder distribution, especially at the region of the solder eyelets surrounding the drill holes. Of course, to the extent needed, with this modified embodiment, it is readily possible to provide a multiple acceleration of the printed circuit board in vertical and/or in horizontal direction.

Figure 5:
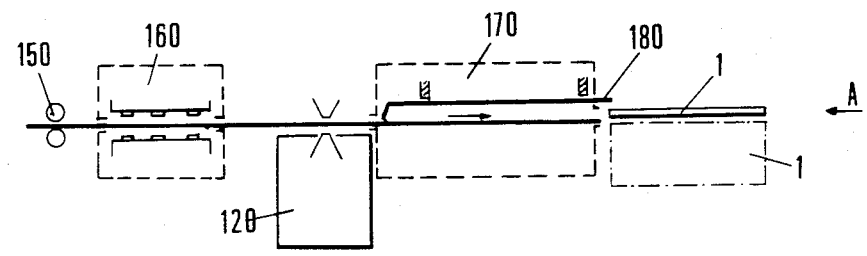
FIG. 5 illustrates a still further embodiment of apparatus which can be used in the performance of the method.
Figure 5:
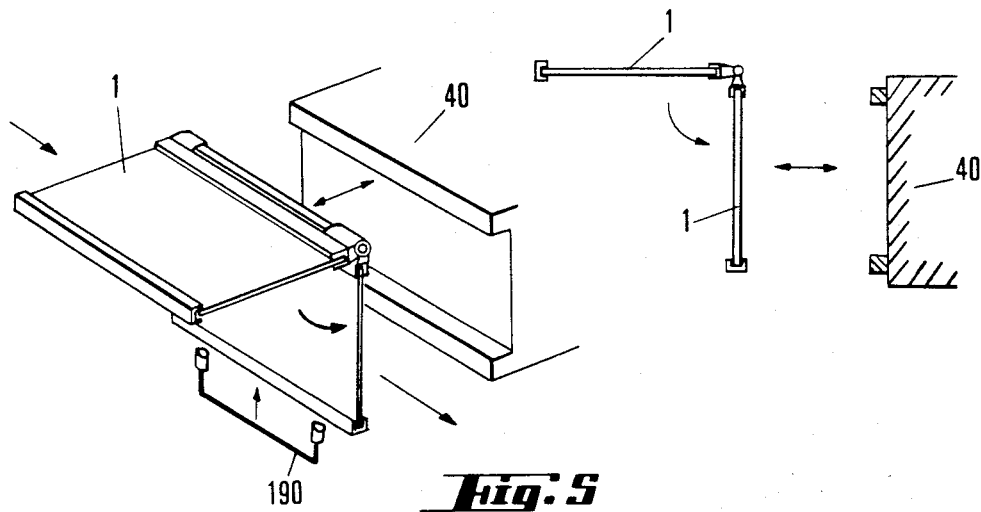

A further embodiment of the method, wherein the coating of the printed circuit boards 1 with solder or the melting of the solder of already pre-soldered printed circuit boards 1 is accomplished in a splash bath, has been schematically illustrated in FIG. 5. Here, the printed circuit board 1 is covered while in a horizontal position with a flux agent 150, pre-heated in a heating station 160, and then further drawn through the splash bath 120 while in a substantially horizontal position. Thereafter, the soldered printed circuit board 1 arrives at a heat retaining station 170 and then is quickly withdrawn therefrom by means of gripper device 180 and turned through 90°, so that such printed circuit board 1 now is positioned perpendicular to the transport plane. Just as was the case for the arrangement of FIG. 4, there is thereafter again initially accomplished a knocking-out of the solder in the direction of the printed circuit board plane, for instance downwardly by means of a plunger 190 or equivalent structure, and then a knocking-out in a direction perpendicular to the plane of the printed circuit board. The heat retention station 170 serves to prevent undesired cooling-off of the printed circuit board 1, before such has completely passed through the splash bath 120 and can have the solder knocked-off of such printed circuit board as previously explained. Also, in this case there is readily possible a multiple knocking-out of the undesired excess solder from the printed circuit board 1.

While there are shown and described present preferred embodiments of the invention, it is to be distinctly understood that the invention is not limited thereto, but may be otherwise variously embodied and practiced within the scope of the following claims.

Accordingly, what we claim is:

1. A method for the removal of excess solder out of drill holes of a printed circuit board not yet equipped with electrical components, each of the drill holes having an axis and primarily serving to receive and electrically connect the terminals of electric components to metalized conductor tracks on the surface of the printed circuit board, comprising the steps of:

mounting the printed circuit board on a frame;

accelerating at least once said frame including the printed circuit board in the direction of the axis of the drill holes while in a condition in which the solder applied to the printed circuit board is still in a molten state; and after a predetermined travel of the accelerated frame including the printed circuit board bringing to a sudden standstill the accelerated frame including the printed circuit board in a manner such that excess solder is simultaneously propelled-out of all of the drill holes of the printed circuit board.

2. The method as defined in claim 1, further including the steps of:

during the acceleration of the printed circuit board subjecting such to gravitational acceleration; and braking the printed circuit board to bring the same to standstill after said predetermined travel in a position which is essentially perpendicular to the direction of movement of the printed circuit board.

3. The method as defined in claim 2, further including the steps of:

directly after the first braking of the printed circuit board accelerating such printed circuit board a second time and again braking such printed circuit board, in order to thereby remove any excess solder which has not been removed in the preceding accelerating and bring-to-a-standstill operation.

4. The method as defined in claim 3, further including the step of:

accomplishing the initial acceleration of the printed circuit board throughout a shorter distance than the subsequent second acceleration of said printed circuit board.

5. The method as defined in claim 1, including the further step of:

placing the printed circuit board in a substantially horizontal position with the axes of the drill holes extending substantially vertically prior to said acceleration of the printed circuit board.

6. A method for the removal of excess solder out of drill holes of a printed circuit board not yet equipped with electrical components, each of the drill holes having an axis, comprising the steps of:

mounting the printed circuit board on a frame;

accelerating at least once the frame including the printed circuit board in a direction normal to the axis of the drill holes while in a condition in which the solder applied to the printed circuit board is still in a molten state; and after a predetermined travel of the accelerated frame including the printed circuit board bringing to standstill the accelerated frame including the printed circuit board in a manner such that excess solder is simultaneously propelled out of all of the drill holes of the printed circuit board.

7. A method for the removal of excess solder out of drill holes of a printed circuit board not yet equipped with electrical components, each of the drill holes having an axis, comprising the steps of:

mounting the printed circuit board on a frame;

first accelerating at least once the frame including the printed circuit board in a direction normal to the axis of the drill holes while in a condition in which the solder applied to the printed circuit board is still in a molten state;

after a first predetermined travel of the accelerated frame including the printed circuit board bringing to standstill the accelerated frame including the printed circuit board in a manner such that at least excess solder flowing downwardly along the surface of the printed circuit board is simultaneously knocked-off from the printed circuit board;

subsequently accelerating at least once the frame including the printed circuit board in the direction of the axis of the drill holes while in a condition in which the solder applied to the printed circuit board is still in a molten state; and after a second predetermined travel of the accelerated frame including the printed circuit board bringing to standstill the accelerated frame including the printed circuit board, in order to thereby remove any excess solder which has not been removed in the preceding accelerating and bring-to-a-standstill operation.

8. The method as defined in claim 7, further including the steps of:

prior to said step of mountng the printed circuit board on said frame moving the printed circuit board essentially while in a horizontal position through a splash solder bath;

after the step of mounting said printed circuit board on said frame rotating the frame including the printed circuit board through an angle of about 90° in relation to a horizontal plane;

said step of first accelerating the printed circuit board entailing accelerating the printed circuit board in the direction of the plane of the printed circuit board and in a direction extending normal to the axis of the drill holes thereof relative to a first impact location;

said step of bringing to standstill the accelerated frame including the printed circuit board after said first predetermined travel thereof entailing the step of bringing the frame including the printed circuit board to a sudden standstill by braking the same at said first impact location;

said step of subsequently accelerating the printed circuit board entailing accelerating the printed circuit board at least once in a direction essentially perpendicular to the plane of the printed circuit board and relative to a further impact location; and said step of bringing to standstill the accelerated frame including the printed circuit board after said second predetermined travel thereof entailing the step of bringing the frame including the printed circuit board to a sudden standstill by impacting the same at said further impact location.

9. The method as defined in claim 7, further including the step of:

utilizing for mounting the printed circuit board a frame having a mass which is much larger than the mass of the printed circuit board.

10. The method as defined in claim 7, further including the step of:

mounting the printed circuit board in the frame at the longitudinal edges of the printed circuit board.

* * * * *

UNITED STATES PATENT AND TRADEMARK OFFICE
CERTIFICATE OF CORRECTION

PATENT NO.   :   4,501,770
DATED        :   February 26, 1985
INVENTOR(S)  :   IMRE BAJKA et al It is certified that error appears in the above-identified patent and that said Letters Patent is hereby corrected as shown below:

Column 2, line 47, please delete "." (period) and insert --, in other words de-tinning or de-soldering such printed circuit boards, in an extremely reliable, efficient and economical fashion.--

Signed and Sealed this

Sixteenth Day of July 1985

[SEAL]

Attest:

DONALD J. QUIGG

Attesting Officer          Acting Commissioner of Patents and Trademarks